United States Patent [19]
Wu

[11] Patent Number: 5,650,351
[45] Date of Patent: Jul. 22, 1997

[54] METHOD TO FORM A CAPACITOR HAVING MULTIPLE PILLARS FOR ADVANCED DRAMS

[75] Inventor: Shye-Lin Wu, Hsinchu, Taiwan

[73] Assignee: Vanguard International Semiconductor Company, Hsin-Chu, Taiwan

[21] Appl. No.: 585,033

[22] Filed: Jan. 11, 1996

[51] Int. Cl.$^6$ ................ H01L 21/70; H01L 27/00
[52] U.S. Cl. ................ 437/52; 437/60; 437/919
[58] Field of Search ................ 437/47–48, 52, 437/60, 919; 148/DIG. 14; 257/306–310

[56] References Cited

U.S. PATENT DOCUMENTS

| | | | |
|---|---|---|---|
| 5,164,881 | 11/1992 | Ahn | 437/52 |
| 5,204,280 | 4/1993 | Dhong et al. | 437/52 |
| 5,227,322 | 7/1993 | Ko et al. | 437/52 |
| 5,254,503 | 10/1993 | Kenney | 437/228 |
| 5,256,587 | 10/1993 | Jun et al. | 437/52 |
| 5,302,540 | 4/1994 | Ko et al. | 437/47 |
| 5,304,828 | 4/1994 | Kim et al. | 257/309 |
| 5,338,700 | 8/1994 | Dennison et al. | 437/60 |
| 5,342,800 | 8/1994 | Jun | 437/52 |
| 5,358,888 | 10/1994 | Ahn et al. | 437/52 |

OTHER PUBLICATIONS

"A Capacitor–Over–Bit–Line (COB) Cell with A Hemispherical Storage Node For 64MB DRAMS" IEDM Tech Dig Dec. 1990 pp. 655–658, M. Sakao et al.
H. Watanabe et al. "A New Cylindrical Capacitor Using Hemispherical Grained Silicon (HSGSi) For 256 Mb DRAMS" IEDM Tech Dig. Dec. '92 pp. 259–262.
Sanggi Yu et al. "The Honeycomb–Shape Capacitor Structure for ULSI DRAM" IEEE Electron Dev. Letters, vol. 14, No. 8 Aug. 1993 pp. 369–371.
S.L.Wu et al "Tunnel Oxide Prepared By Thermal Oxidation of Thin Polysilicon Film On Silicon (TOPS)" IEEE Electron Device Letters, vol. 14, pp. 379–381, 1993.
Y.K. Jun et al. "The Fabrication & Electrical Properties of Modulated Stacked Capacitor for Advanced DRAM Applications" IEEE Electron Dev. Letters vol. 13, No. 8, Aug. 1992, pp. 430–432.

*Primary Examiner*—H. Jey Tsai
*Attorney, Agent, or Firm*—George O. Saile; William J. Stoffel

[57] ABSTRACT

A method of fabricating a capacitor having multiple pillars is presented. The invention uses an oxidized hemispherical grain silicon (HSG-Si) layer as a masking layer, in a series of masking steps, to form pillarets on a storage electrode. The method begins by forming a storage electrode having a connection to an active area on the substrate. Next, a cap insulation layer and a cap polysilicon layer are formed over the storage electrode. The cap polysilicon layer has grains and has grain boundaries between the grains. The cap polysilicon layer is oxidized thus forming a thicker oxide layer at the grain boundaries. The oxide layer is dry etched exposing the cap polysilicon layer and leaves a grain boundary oxide covering the grain boundaries. Next, the exposed cap polysilicon layer is etched using the grain boundary oxide as a mask forming a plurality of cap polysilicon layer pillarets. The grain boundary oxide is then removed. Then the cap insulation layer is etched using the cap polysilicon layer pillarets as a mask forming cap oxide pillarets. The cap polysilicon layer pillarets are then removed. The storage electrode node is dry etched using the cap oxide pillarets as a mask forming storage electrode pillarets. The cap oxide pillarets are removed. A capacitor dielectric layer and top plate electrode are formed over the storage electrode pillarets and the storage electrode to complete the capacitor.

29 Claims, 6 Drawing Sheets

METHOD TO FORM A CAPACITOR HAVING MULTIPLE PILLARS FOR ADVANCED DRAMS

BACKGROUND OF THE INVENTION

1) Field of the Invention

The present invention relates generally to the fabrication of capacitors and particularly to a method for fabricating a highly integrated semiconductor memory having a capacitor over bit-line (COB) structure and more particularly to a method to form a dynamic random access memory (DRAM) cell having a multiple pillar-shape capacitor.

2) Description of the Prior Art

The development of the semiconductor industry has always followed that of the Dynamic Random Access Memory (DRAM) technology in that DRAM development has led in the use of the highest density technology elements capable of being produced in manufacturable quantities. The development of DRAM's in the 4 Megabit density range began to depart from the twenty year tradition of two-dimensional DRAM designs by the appearance of three-dimensional DRAM cell structures, most notable by the use of trench capacitors. Proposed designs for DRAM cells in 16 MB, 64 MB and high density range have also included the use of multi-plate or stacked storage capacitor cell designs. Although the use of stacked cell technology has rendered the processing of DRAMs more complex such techniques continue to be used extensively.

The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of memory cell as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors.

Since both outer and inner surfaces can be utilized as an effective capacitor area, the cylindrical structure is favorably suitable to the three-dimensional stacked capacitor, and is more particularly suitable for an integrated memory cell which is 64 Mb or higher. Also, an improved stacked capacitor has recently been presented, where pillars or another inner cylinder is formed in the interior of another cylinder. Not only may both of the inner and outer surfaces of the cylinder be utilized as the effective capacitor area, but also the outer surface of the pillars or the inner cylinder formed in the interior of the cylinder. However, even more surface area and capacitance are required to achieve higher densities.

Recently, new technologies have been developed for increasing the effective surface area by modifying the surface morphology of the polysilicon storage electrode itself by engraving or by controlling the nucleation and growth condition of polysilicon. A hemispherical-grain (HSG) polysilicon layer can be deposited over a storage node to increase surface area and capacitance.

The following U.S. patents show related processes and capacitor structures: U.S. Pat. Nos. 5,342,800 to Jun., 5,304,828 to Kim et al., 5,358,888 to Ahn, and 5,302,540 to Ko et al. The following articles show related processes and capacitor structures: M. Sakao et al., "A Capacitor-Over-Bit-Line (COB) Cell With A Hemispherical Storage Node For 64 MB DRAMs," IEDM Tech Dig., Dec 1990, pp. 655–658; H. Watanabe et al., "A New Cylindrical Capacitor Using Hemispherical Grained Silicon (HSG-Si) For 256 Mb DRAMs," IEDM Tech Dig., Dec 1992, pp. 259–262; Sanggi Yu, et al, "The Honeycomb-Shape Capacitor Structure for ULSI DRAM", IEEE Electron Device Letters, Vol., 14, No 8, August 1993, p. 369–371; S. L. Wu et al., "Tunnel Oxide Prepared By Thermal Oxidation Of Thin Polysilicon Film On Silicon (TOPS)," IEEE Electron Device Lett., vol. 14, pp. 379–381, 1993; and Y. K. Jun et. al., "The Fabrication and Electrical Properties of Modulated Stacked Capacitor for Advance DRAM Applications", IEEE Electron Device Letters, vol. 13, no 8, August 1992, p. 430–432.

However, many of these methods require substantially more processing steps or/and planar structures which make the manufacturing process more complex and costly. Also, other process methods rely on etching to a predetermined etch depth which can be quite difficult to control in a manufacturing environment. Therefore, it is very desirable to develop processes that are as simple as possible and also have large process windows.

Recently, capacitor on bit line (COB) combined with the deposition of hemispherical grain silicon layer (HSG-Si) is proposed to increase the effective surface are of the storage node. See M. Sakao et al. But this method has limited capabilities to gain sufficient capacitance for advance (>=256 Mb) DRAM applications. More recently, S. Yu et al. (see above) proposed a honeycomb-shaped capacitor structure to increase storage capacitance. However this method can be improved upon by reducing the leakage current. Therefore, a method is needed which can form multiple pillar-shaped capacitors with a high storage capacitance and a low leakage current.

There is also a challenge to develop methods of manufacturing these capacitors that minimize the manufacturing costs and maximize the device yields. There is also a challenge to develop a method to produce a capacitor with a minimum leakage current, a larger capacitance, a higher reliability and which is easy to manufacture.

SUMMARY OF THE INVENTION

It is an object of the present invention to provide a novel method for fabricating a multiple pillar shaped capacitor which ensures high reliability, low leakage current and large cell capacitance.

It is another object of the present invention to provide a novel method for fabricating a capacitor having multiple pillars of a semiconductor memory device, which has low field leakage, ensures high reliability and large cell capacitance.

It is yet another object of the present invention to provide a method for fabricating a capacitor having multiple pillars for a semiconductor memory device, which allows the capacitance and leakage current to be optimized and uses a minimum of photo operations.

To accomplish the above objectives, the present invention provides a method of manufacturing a capacitor having multiple pillars for a DRAM. The invention involves using an oxidized hemispherical grain silicon (HSG-Si) layer as a masking layer, in the beginning of a series of masking steps, to form pillars on a storage electrode. The method begins by forming a storage electrode having a connection to an active area on the substrate. Next, a cap insulation layer and a cap polysilicon layer are formed over the storage electrode. The cap polysilicon layer has grains and grain boundaries between the grains. The cap polysilicon layer is oxidized thus forming a thicker oxide layer at the grain boundaries. The oxide layer is dry etched exposing portions of the cap polysilicon layer and leaving a grain boundary oxide covering the grain boundaries. Next, the exposed cap polysilicon layer is etched using the grain boundary oxide as a mask forming a plurality of cap polysilicon layer pillarets. The grain boundary oxide is removed. Then the cap insulation layer is etched using the cap polysilicon layer pillarets as a mask forming cap oxide pillarets. The cap polysilicon layer pillarets are then removed. The storage electrode is dry etched using the cap oxide pillarets as a mask forming storage electrode pillarets. The cap insulation pillarets then are removed. An optional hemispherical grain polysilicon (HSG-Si) layer can be formed over the storage node pillarets and the storage electrode to further increase capacitance. A capacitor dielectric layer and top plate electrode are formed over the storage electrode pillarets and the storage electrode to complete the capacitor. The capacitor is preferably part of a dynamic random access memory device.

The method of the current invention forms a multi pillar shaped capacitor which has a high surface area and capacitance. The capacitor reduces the amount of field leakage since the polysilicon storage node pillars are not subjected to an enhanced oxidation at the grain boundaries and a damaging RIE etch. The method prevents leakage current of the storage capacitors by eliminating sharp tips at grain boundaries on the core storage node by using the cap polysilicon and cap insulation layers as masks. The method does not produce sharp tips on the storage node pillars because the cap polysilicon layer pillars that undergo the enhanced oxidation, which forms the sharp tips, are used as a masking layer—not as the storage electrode pillars. The polysilicon layer pillarets are used as a mask to etch the storage electrode to form pillarets with smooth edges. Moreover, since the size and spacing of the pillarets can be controlled by controlling the grain size, the capacitance and leakage current can be optimized by controlling the variables that control grain size, such as the doping levels of the cap polysilicon and the oxidation conditions. Moreover, the process is simple and inexpensive to manufacture.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Now in keeping with the objectives of this invention, the method for forming a DRAM storage capacitor having a capacitor with multiple pillars is described in detail. The sequence of fabrication steps for a multiple pillar shaped capacitor is shown in FIGS. 1 through 11.

Figure 1:
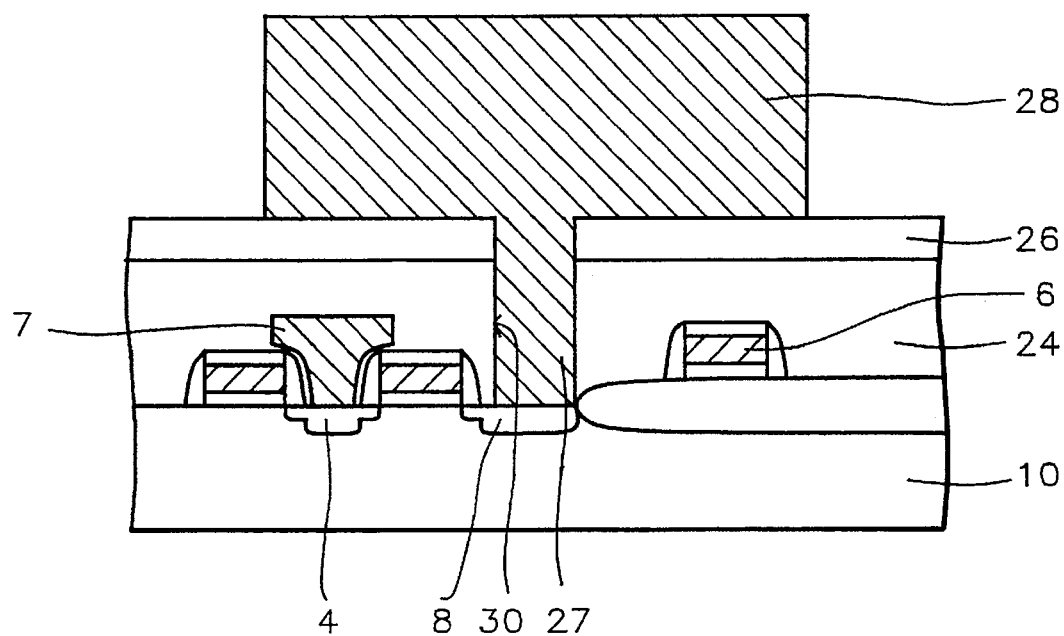
FIGS. 1 through 11 are cross sectional views for illustrating a first embodiment for a method for manufacturing a capacitor having multi-pillars according to the present invention.

Referring to FIG. 1, it is assumed that either a silicon substrate 10 is formed or an unit semiconductor element, for example a MOSFET, which is partially completed is formed on the silicon substrate 10 upon which the silicon layer according to the present invention will be deposited. The substrate can have active areas including an array of memory cells, each of the memory cells having a MOSFET transistor. The transistor can comprise a source 8, drain 4, and a transfer gate 6 and other devices, such as a bit line 7, word lines 6, p and n wells, and field oxide regions 11. See FIG. 1.

As shown in FIG. 1, a first planarization layer 24 and a first dielectric layer 26 are formed over the substrate 10 surface. The first planarization layer 24 is preferably composed of silicon nitride, silicon oxide, or a doped silicon oxide, such as phosphosilicate glass (PSG), or borophosphosilicate glass; and more preferably is formed of silicon nitride. The first planarization layer 24 has a thickness in the range between about 500 to 10,000 Å and more preferably about 4000 Å. The first planarization layer 24 can include several underlying layers, such as a conformal silicon oxide layer.

The first dielectric layer 26 serves as an optional insulation layer and is preferably composed of silicon nitride. The first dielectric layer 26 can be formed by a CVD process using Tetraethylorthosilicate (TEOS) by depositing silicon oxide at 650° to 750° C. in a low pressure chemical vapor deposition reactor. The silicon oxide layer 26 has a thickness in the range of between about 500 and 5000 Å and more preferably about 2000 Å.

Next, a node contact hole 30 is etched through the first planarization layer 24 and the first silicon oxide layer 26 exposing an active region such as a source 08. The node contact hole 30 can have an open area in the range of between about 0.01 and 0.25 $\mu m^2$.

A first polysilicon layer 28 is then formed on the first dielectric layer 26. The first polysilicon layer 28 fills the node contact hole 30 and makes an electrical connection to a source region on the substrate surface. The first poly layer 28 can be deposited as amorphous silicon as this layer becomes polysilicon in subsequent heat processing. The layer is preferably in-situ phosphorus doped. The first polysilicon layer 28 is formed of doped polysilicon having an impurity concentration in the range between about 1E19 to 5E21 atoms/cm$^3$ and preferably has a thickness in the range between about 500 to 10,000 Å and more preferably about 7000 Å.

Alternately, layer 28 can be formed of two separate layers 27 28. A first conductive layer 27 can fill the node contact hole 30 and a second layer 28 can be formed over the first dielectric layer 26. Both layers 27 and 28 can be formed of polysilicon as described above.

Figure 2:
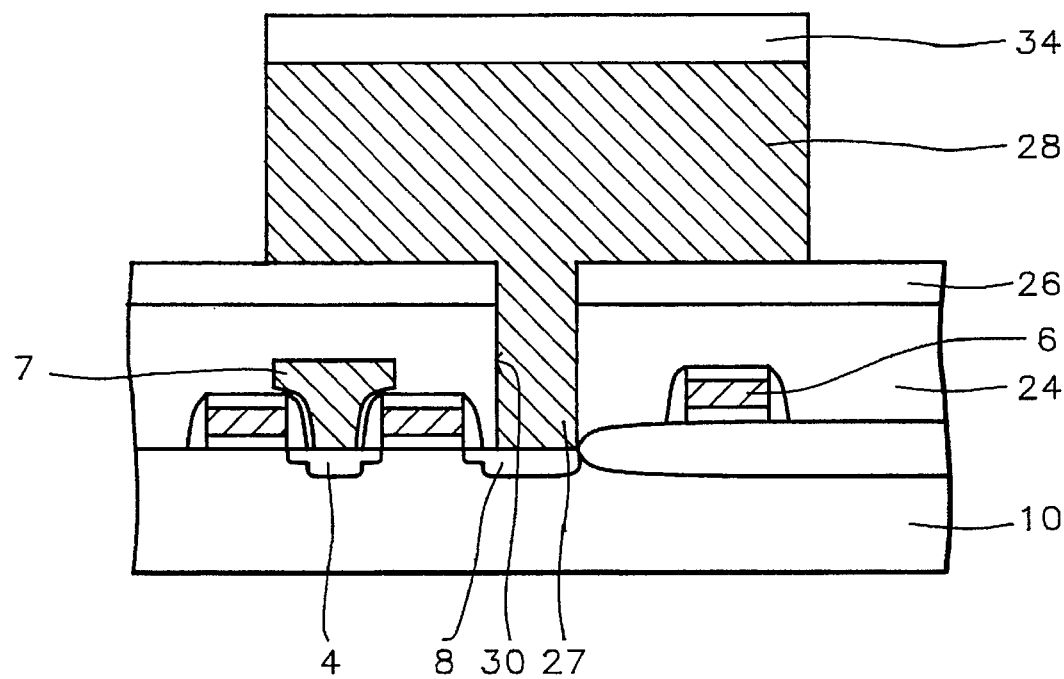

Referring to FIG. 2, a cap insulation layer 34 is deposited covering the first polysilicon layer 28. The cap insulation layer 34 is preferably formed of silicon oxide or silicon nitride and preferably has a thickness in the range of between about 300 and 3000 Å and more preferably about 1000 Å. The cap insulation layer can be formed by a CVD process using Tetraethylorthosilicate (TEOS) by depositing silicon oxide at 650° to 750° C. in a low pressure chemical vapor deposition reactor.

Figure 3:
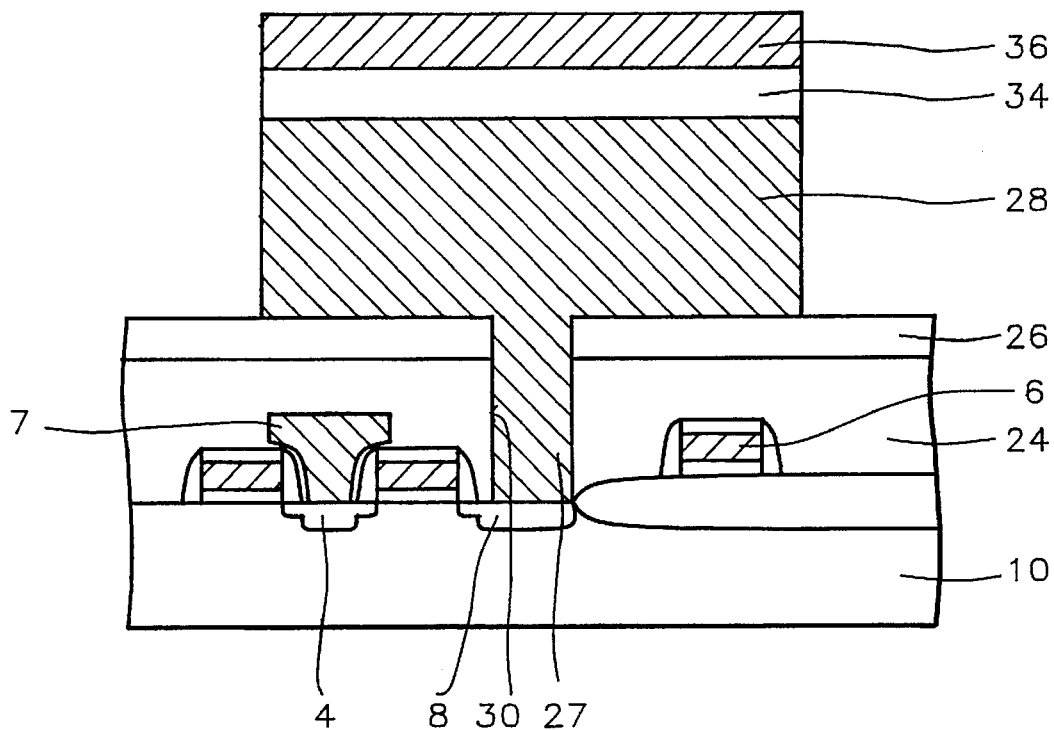

Referring to FIG. 3, a cap polysilicon layer 36 is formed over the cap insulation layer 34. The cap polysilicon layer 36 has grains and grain boundaries between the grains. The cap polysilicon layer 36 is preferably formed of amorphous silicon or an in-situ p-doped polysilicon having a thickness in the range of between about 300 and 3000 Å and more preferably about 1000 Å. The cap polysilicon layer 36 has a n-type impurity doping (such as in-situ $POCl_3$) in the range of between about 1E19 and 5E21 atoms/cm$^3$ and more preferably about 5E20 atoms/cm$^3$. Subsequent heat processing changes the amorphous silicon into polysilicon.

The cap polysilicon layer 36 is preferably be formed of polysilicon, amorphous silicon or hemispherical shaped grains (HSG). The cap polysilicon layer 36 can be formed of amorphous silicon by a decomposition of silane $SiH_4$ in a hot wall vertical LPCVD reactor, at a pressure of between about 80 to 200 mtorr and a temperature of between about 500° to 560° C. to produce hemispherical shaped grains (HSG) having a diameter of between about 200 to 1500 Å. The layer can be doped with an in-situ $POCl_3$ process to an impurity concentration preferably in the range between about 5E19 to 5E20 atoms/cm$^3$.

The cap polysilicon layer 36 and the thermal oxide layer 38 can be formed by depositing a polysilicon layer by a decomposition of silane $SiH_4$ in a hot wall LPCVD reactor, at a pressure of between about 150 to 500 mtorr and a temperature of between about 600° to 630° C. to produce hemispherical shaped grains (HSG) having a diameter of between about 500 to 1500 Å. Next, the HSG layer is doped with $POCl_3$ at about 900° C. and oxidized in a wet or dry oxidation process thereby forming the thermal oxide layer 38 having a thickness in the range of between about 300 and 1500 Å.

Figure 4:
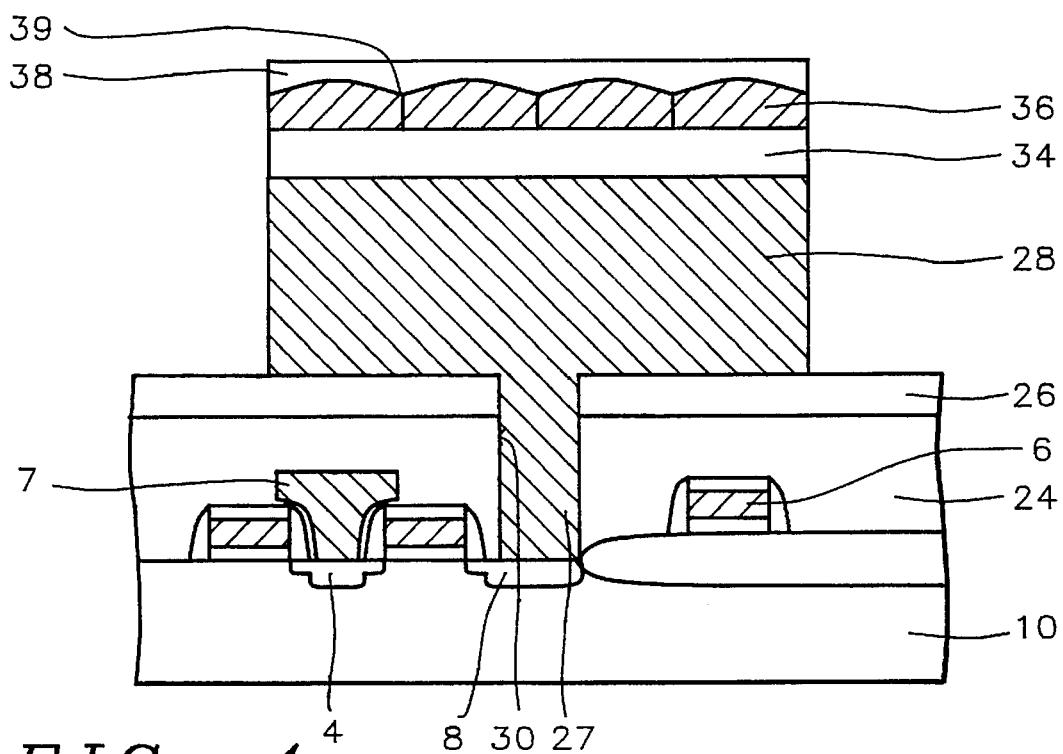

Referring to FIG. 4, a thermal oxide layer 38 is grown over the cap polysilicon layer 36. The thermal oxide grows thicker at the grain boundaries 39. The thermal oxide layer 38 preferably has a thickness at the grain boundaries 39 in the range of between about 300 and 1500 Å and a thickness over the middle of the grains in the range of between about 100 and 500 Å.

The thermal oxide layer 38 can be formed in a wet oxidation process with a temperature in the range of between about 750° and 950° C. and at a pressure in the range of between about 1 and 760 torr. Alternately, the thermal oxide layer 38 can be formed in a dry oxidation at a temperature in the range of between about 800° and 1000° C. at a pressure in the range of between about 1 and 760 torr.

The grains preferably have a diameter in the range of between about 500 and 2000 and more preferably about 1000 Å. The spacing between adjacent grains is preferably in the range of between about 100 and 700 and more preferably about 500 Å. The size and spacing of the grains is largely determined by three factors: (a) the thickness of the polysilicon layer, (b) the doping level of the polysilicon, and (c) the thermal oxide layer 38 oxidation conditions.

Figure 5:
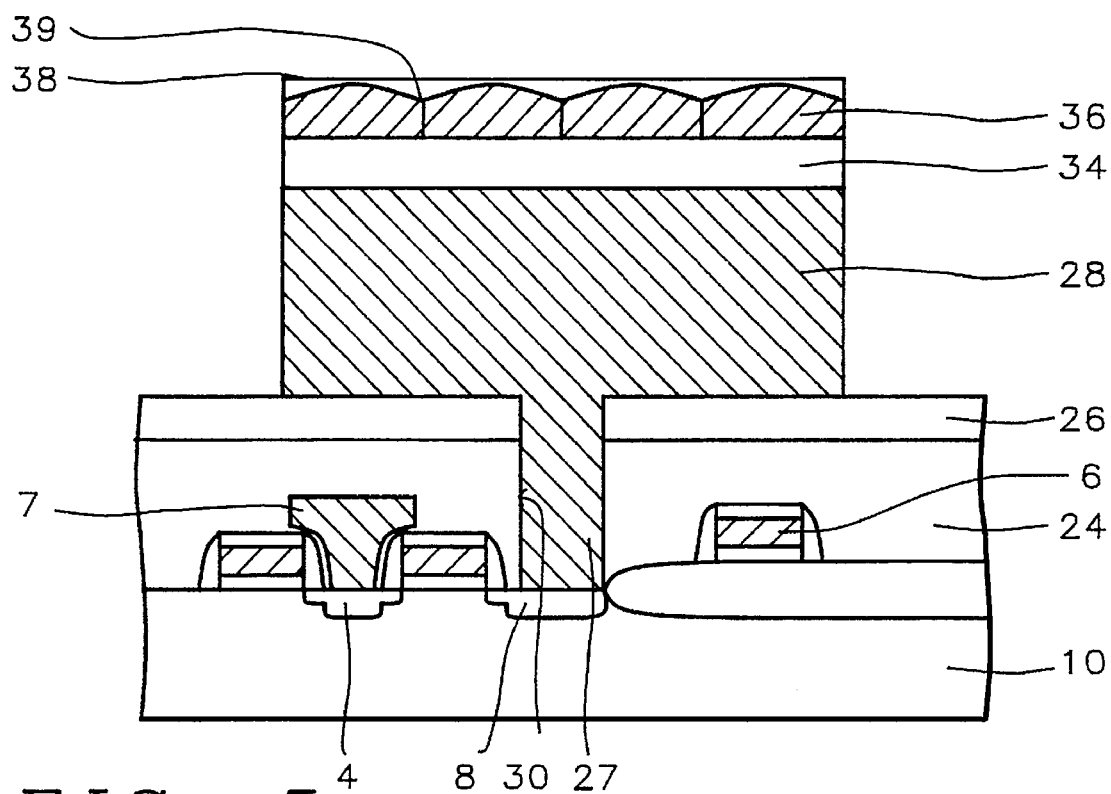
Figure 6:
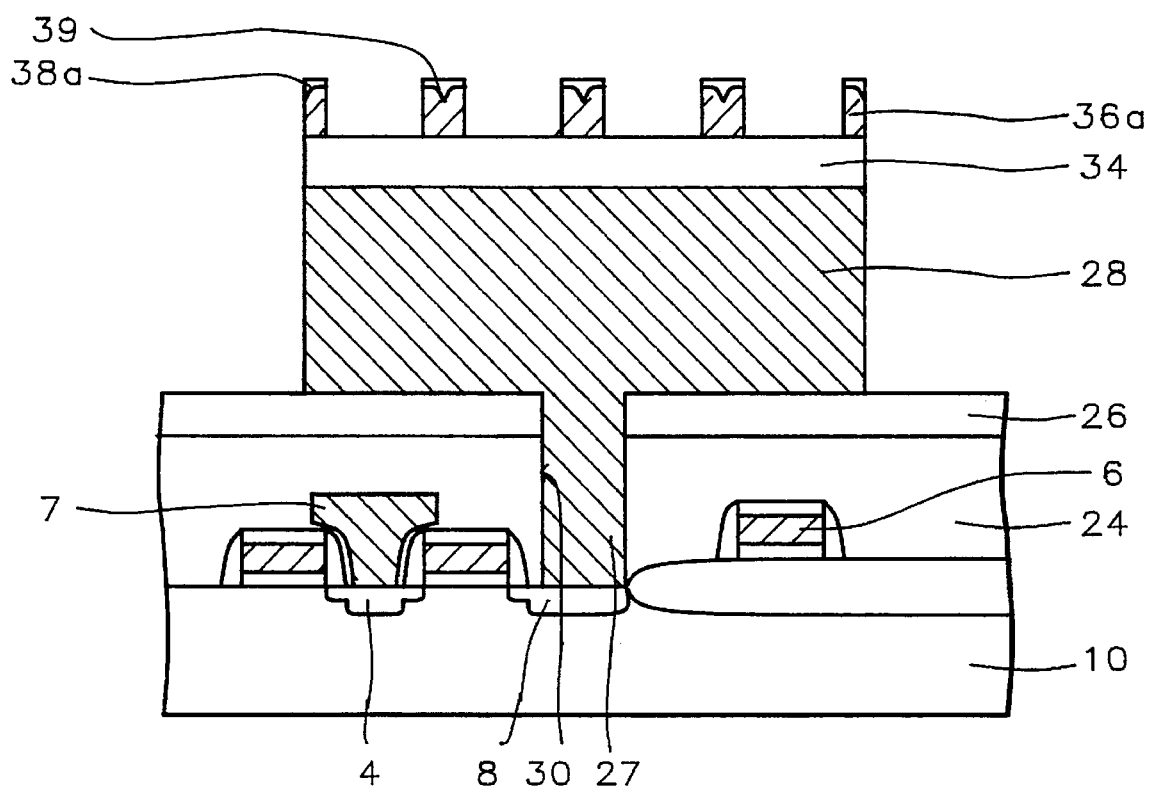

As shown in FIG. 5, the thermal oxide layer 38 is etched back exposing the cap polysilicon layer 36 and leaving thermal oxide islands 38A (i.e., grain boundary oxide 38A) covering the grain boundaries 39. The etch is preferably a dry etched, such as a RIE etch performed with $CF_4$ and $H_2$ chemistry and is preferably performed with $CF_4$ and Ar and $CHF_3$ etch chemistry. The oxide etch has a $SiO_2$ to Si selectivity between about 10:1 and 30:1.

The thermal oxide islands 38A have a thickness in the range of between about 100 and 1500 Å and have a diameter in the range of between about 100 and 1500 Å. The oxide islands 39 preferably have a circular shape.

The exposed cap polysilicon layer 36 is etched using the thermal oxide islands 38A as a mask forming a plurality of cap polysilicon layer pillarets 36A. The etching of the exposed cap polysilicon layer 36 is preferably performed with an polysilicon RIE etch using $Cl_2$ and HBr reactants.

Next, the thermal oxide islands 38A are removed in an oxide etch thereby exposing the polysilicon pillarets 36A. See FIG. 7. Note that the polysilicon pillars 36A have "sharp tips" at the top under the oxide islands 38A (i.e., grain boundary oxide). The low spot 39 in the center of the tips (see FIG. 7, element 36A) in the center of the pillars 36A is a grain boundary 39 where oxide grows the fastest and the outer higher "tips" are portions of the grain where oxide does not grow as fast. The "sharp tips", when used as the storage node, cause high leakage current due to the high electric fields generated by the sharp tip surfaces. In the present invention, since the sharp tips 36A of the cap polysilicon pillarets 36A not part of the capacitor and (see FIGS. 8 & 9, element 28A) are only part of a masking layer, the capacitor of the invention does not have the leakage current problem of the prior art.

Figure 7:
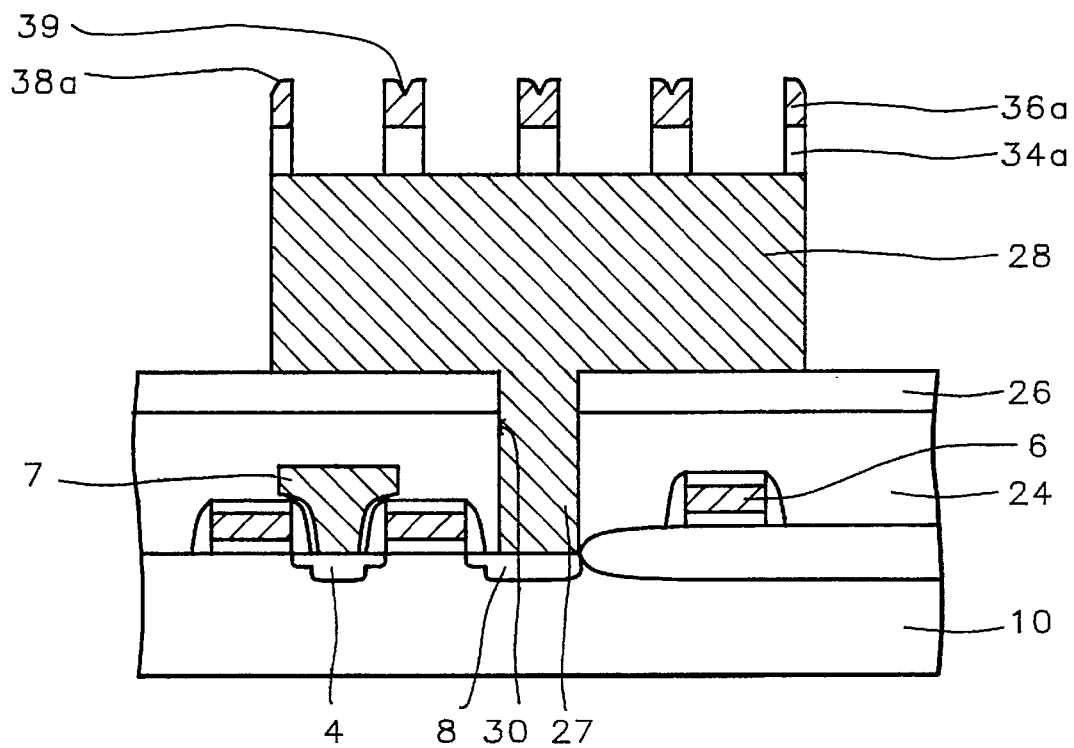

Referring to FIG. 7, the cap insulation layer 34 is etched using the cap polysilicon layer pillarets 36A as a mask forming cap insulation layer pillarets 34A. The etch is preferably an anisotropic etch which is selective to silicon oxide over polysilicon. The cap insulation layer is removed by anisotropic reactive ion etching with carbon tetrafluoride ($CF_4$) and oxygen as the etching ambient. Preferably, the cap insulation layer 34 can be removed using a $CF_4/CHF_3$/Ar anisotropic etch with an etch oxide to polysilicon selectivity in the range of between about 10:1 and 30:1 and more preferably about 20:1.

The cap insulation layer pillarets 34 (e.g., spaced pillars, pillarets, etc.) can have a diameter in the range of between about 100 and 1000 Å and a height in the range of between about 300 and 2000 Å. Next, the cap polysilicon layer pillarets 36A are removed as shown in FIG. 8.

Figure 8:
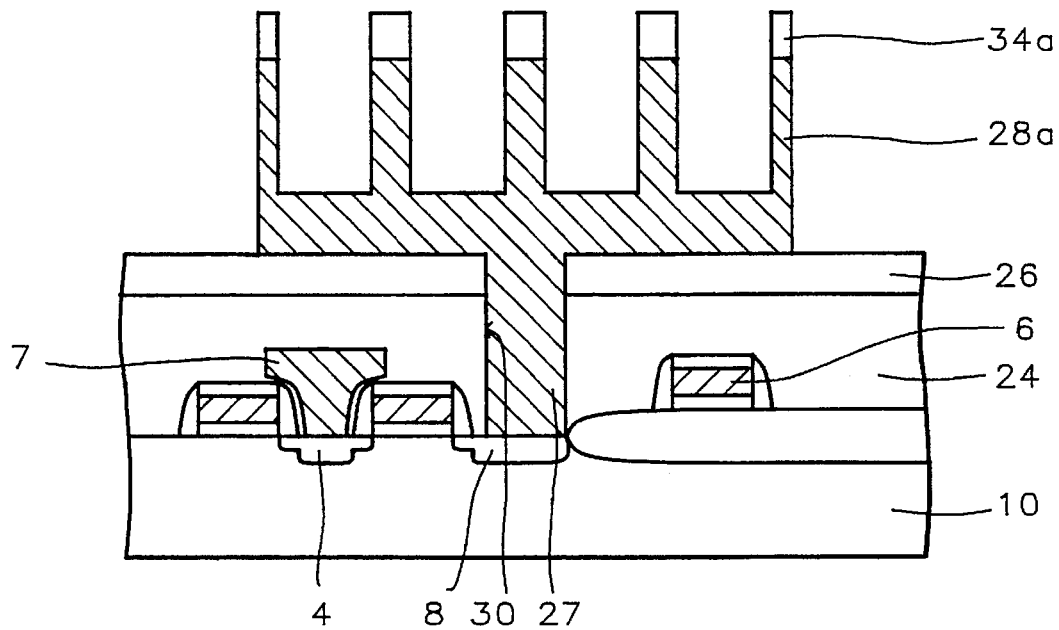

Referring to FIG. 8, the first polysilicon layer 28 is now etched using the cap oxide pillarets 34A as a mask forming storage node pillarets 28A. Preferably the etch is a RIE with an etch chemistry of $Cl_2$ and HBr.

The storage electrode pillarets 28A have a height in the range of between about 500 and 6000 Å and a width in the range of between about 300 and 2000 Å and a spacing between adjacent pillars in the range of between about 500 and 3000 Å. Next, the cap oxide pillarets 34A are removed with an etch.

Figure 9:
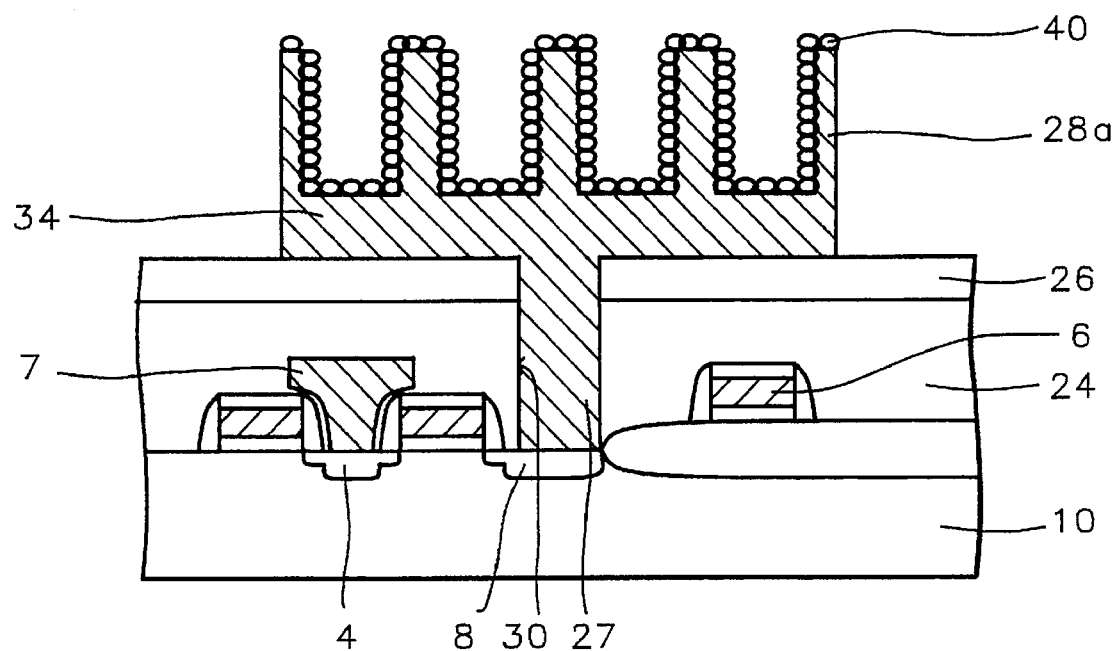
Figure 10:
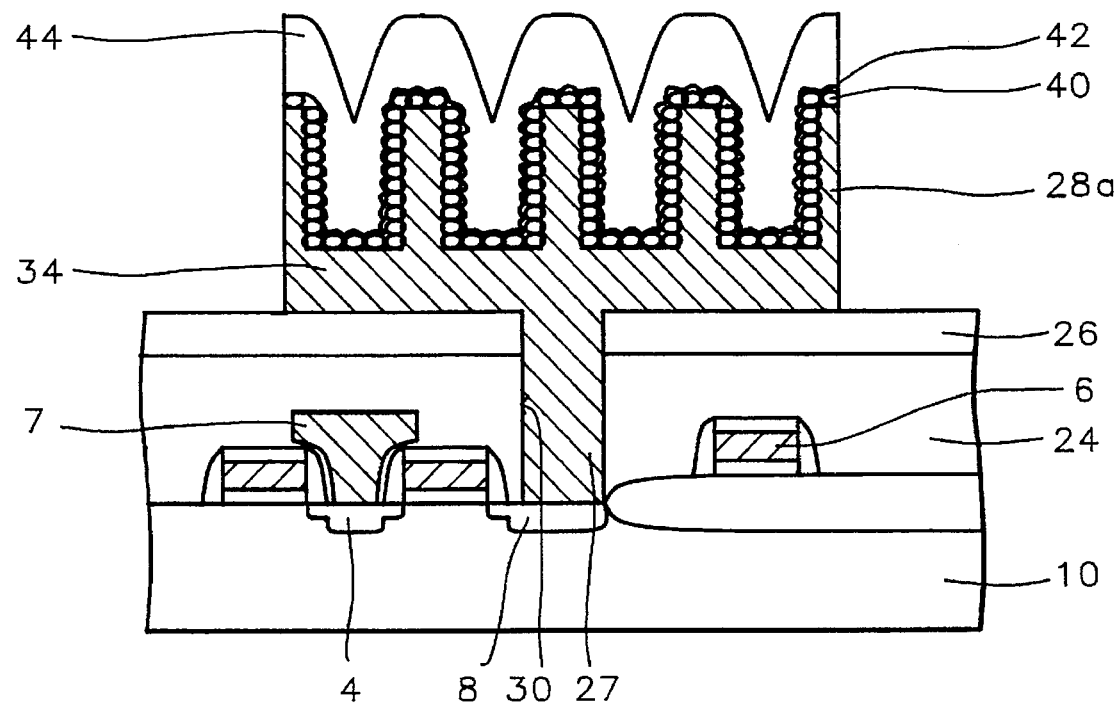

Referring to FIG. 9, an optional hemispherical grain polysilicon (HSG-Si) layer 40 can be over the storage electrode pillarets 28A and the first polysilicon layer 28. The average grain size is considered the thickness of the HSG-Si layer 40. The HSG-Si layer 40 can have a thickness in the range of between about 50 and 1000 Å and more preferably about 500 Å.

In accordance with preferred embodiment of the present invention, the hemispherical polysilicon deposition process is preferably carried out under conditions of either: (a) in an atmosphere of $SiH_4$, a pressure between about 0.1 to 10 torr, at a temperature in the range between about 560° to 600° C. or (b) in an atmosphere of $Si_2H_6$, a pressure of in the range between about 0.1 to 1 torr, at a temperature in the range between about 570° to 610° C.

Also, the rugged polysilicon layer 40 (e.g., hemispherical grain silicon) can be formed by a conventional low temperature deposition and/or anodic process. For example, polysilicon can be deposited from the decomposition of silane $SiH_4$ in a hot wall vertical LPCVD reactor, at a pressure of about 0.2 torr and a temperature of about 560°

C. to produce hemispherical shaped grains (HSG) having a diameter of about 800 Å. Using a temperature of about 565° C. leads to cylindrical grains. Caution must be used to carefully control temperature on the reactor during deposition since deposition deposited films can become amorphous if the temperature falls to about 550° C.

Subsequently, the first polysilicon layer 28 and the a hemispherical grain polysilicon (HSG-Si) layer 40 are patterned to form a storage electrode 28. A conventional photo etch process is used to pattern the first polysilicon layer into the core storage electrode 28 as shown in FIG. 9. The storage electrode 28 preferably has a circular, square or rectangular shape.

Next, a capacitor dielectric layer 42 is deposited over the bottom storage electrode 28. The capacitor dielectric layer can be composed of a triple film of Oxide/Nitride/Oxide (ONO), a composite film of nitride/oxide, silicon nitride, silicon oxide or a high dielectric film such as tantalum oxide ($Ta_2O_5$). The dielectric layer 42 has a thickness in the range between about 20 to 300 Å and more preferably about 50 Å.

A top plate electrode 44 is formed over the capacitor dielectric layer 42 thereby forming a memory device having a multi-pillar shape capacitor. The top plate electrode is preferably formed of doped polysilicon having a thickness in the range between about 500 to 3000 Å and more preferably about 2000 Å; and an impurity concentration in the range between about 5E19 and 5E21 atoms/$cm^3$ and more preferably about 5E20 atoms/$cm^3$.

Figure 11:
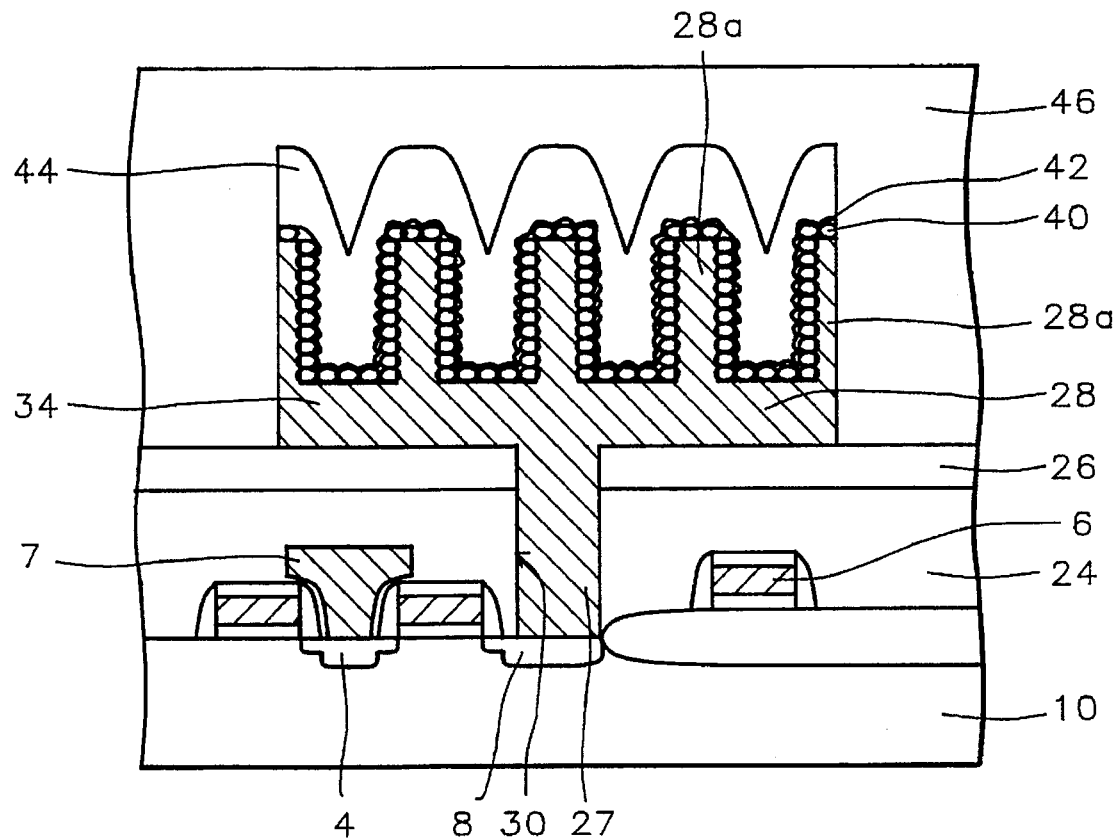

Referring to FIG. 11, a top insulation layer 46 is then formed over the top plate electrode 24. The top insulation layer 46 is preferably formed of silicon nitride, silicon oxide, doped silicon oxide, TEOS and BPSG. The top insulation layer 46 is more preferably formed of borophosphosilicate glass (BPSG) and preferably has a thickness in the range of between about 500 and 8000 Å and more preferably about 1000 Å.

Figure 12:
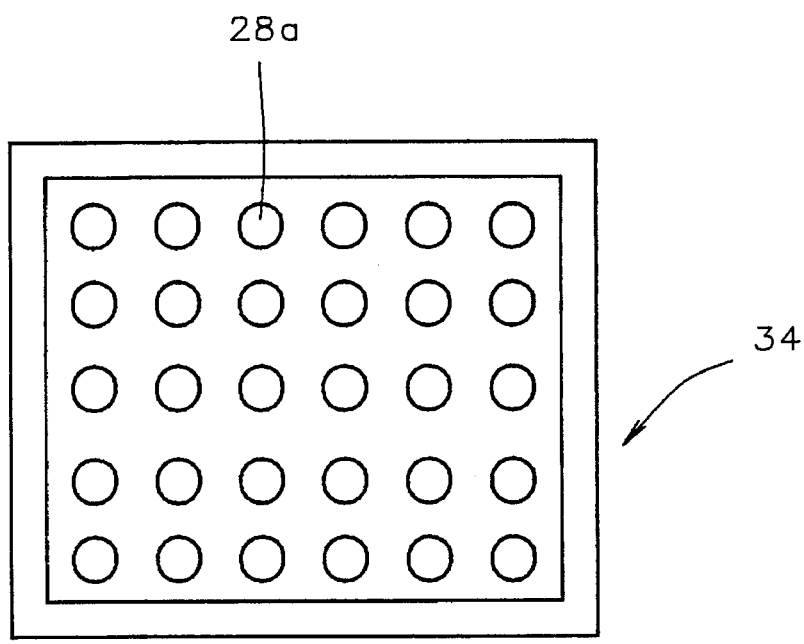
FIG. 12 is a top plan view for illustrating a first embodiment for a method for manufacturing a multi-pillar shaped capacitor of a semiconductor memory device according to the present invention.

FIGS. 11 and 12 illustrate an example of a memory cell having capacitor with multi-pillars made by a process in accordance with the present invention. The capacitor storage electrode 28 of this invention is located above a capacitor node contact with a source region 8 in the substrate 10, a transfer gate 6, a bit line 7, field oxide 11 and the capacitor storage node 34 has a plurality of cylindrical projections 28A (e.g., pillars, pillarets) projecting vertically upward from the storage electrode 28. FIG. 12 is a top down view of the capacitor. It is understood a plurality of memory cells would be formed on a chip and would be connected with the appropriate metallurgy and passivation layers (not shown).

The method of the current invention forms a capacitor having multi pillars which has a high surface area and capacitance. The capacitor has a reduced field leakage current since the polysilicon storage electrode pillars 28A do not have sharp tip edges because they are formed by an etch process. Sharp tip edges are created by the enhanced oxidation at the grain boundaries and damaging RIE etches which the cap polysilicon layer pillars 36A are subjected to. Unlike the prior art processes, the method prevents leakage current of the storage capacitors by eliminating sharp tips at grain boundaries on the pillars 28A of the core storage electrode 28 by using the cap polysilicon layer 36 and cap insulation layer 34 as etch masks. Moreover, the capacitance and leakage current of the capacitor can be optimized by controlling the size and spacing of the pillarets 28A. The pillaret 28A size and spacing can be controlled by controlling the variables that control cap polysilicon layer 36 grain size, such as the doping levels of the cap polysilicon layer 36 and the oxidation conditions. Moreover, the process is simple and inexpensive to manufacture.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a memory device having a multiple pillar-shaped capacitor on a substrate, said substrate having a conductive word line and a transistor, said transistor having a source, a drain, and a transfer gate; the method comprises the steps of:

sequentially forming a first planarization layer and a first silicon nitride layer over a substrate surface;

etching a node contact hole through said first silicon nitride layer and said first planarization layer to expose said source;

forming a first polysilicon layer on said first silicon nitride layer and filling said node contact hole thereby making an electrical connection to said source;

depositing a cap insulation layer covering said first polysilicon layer;

forming a cap polysilicon layer over said cap insulation layer; said cap polysilicon layer having grains and having grain boundaries between said grains;

oxidizing said cap polysilicon layer to form a thermal oxide layer over said cap polysilicon layer, said thermal oxide layer growing thicker at said grain boundaries;

etching back said thermal oxide layer exposing portions of said cap polysilicon layer and leaving thermal oxide islands covering said grain boundaries;

etching the exposed portions of said cap polysilicon layer using said thermal oxide islands as a mask forming a plurality of cap polysilicon layer pillarets;

removing said thermal oxide islands;

etching said cap insulation layer using said cap polysilicon layer pillarets as a mask forming cap insulation layer pillarets;

removing said cap polysilicon layer pillarets;

etching said first polysilicon layer using said cap insulation layer pillarets as a mask forming storage electrode pillarets;

removing said cap insulation layer pillarets;

forming a hemispherical grain polysilicon (HSG-Si) layer over said storage electrode pillarets and said first polysilicon layer;

patterning said first polysilicon layer and said a hemispherical grain polysilicon (HSG-Si) layer to form a storage electrode;

forming a capacitor dielectric layer over said storage electrode pillarets and said storage electrode; and forming a top plate electrode over said capacitor dielectric layer thereby forming said memory device having said multi-pillar shape capacitor.

2. The method of claim 1 wherein said first planarization layer is composed of a material selected from the group consisting of silicon oxide and borophosphosilicate glass, and has a thickness in a range between about 500 to 10,000 Å.

3. The method of claim 1 wherein said first planarization layer comprises a first silicon oxide layer and a bottom borophosphosilicate glass (BPSG) layer, said first silicon oxide layer is formed by a chemical vapor deposition process using tetraethylorthosilicate and has a thickness in a range of between about 500 and 5000 Å.

4. The method of claim 1 wherein said cap insulation layer has a thickness in a range of between about 300 and 3000 Å.

5. The method of claim 1 wherein said cap polysilicon layer is formed of amorphous silicon having a thickness in a range of between about 300 and 3000 Å and a p-type impurity doping in a range of between about 1E19 and 5E21 atoms/cm$^3$.

6. The method of claim 1 wherein said cap polysilicon layer is formed of amorphous silicon by a decomposition of silane $SiH_4$ in a hot wall vertical LPCVD reactor, at a pressure of between about 80 to 200 mtorr and a temperature of between about 500° to 560° C. to produce hemispherical shaped grains (HSG) having a diameter of between about 200 to 1500 Å.

7. The method of claim 1 wherein said cap polysilicon layer is formed by depositing a polysilicon layer by a decomposition of silane ($SiH_4$) in a hot wall LPCVD reactor, at a pressure of between about 150 to 500 mtorr and a temperature of between about 600° to 630° C. to produce hemispherical shaped grains (HSG) having a diameter of between about 500 to 1500 Å followed by a doping with $POCl_3$ at 900° C.

8. The method of claim 1 wherein said thermal oxide layer has a thickness at the grain bounties in the a of between about 300 and 1500 Å and a thickness over said grains in a range of between about 100 and 500 Å.

9. The method of claim 1 wherein said thermal oxide layer is formed in a wet oxidation process with a temperature in a range of between about 750° and 950° C. and at a pressure in a range of between about 1 and 760 torr.

10. The method of claim 1 wherein said etching back of said thermal oxide layer is performed with $CF_4$, $CHF_3$ and Ar reactants.

11. The method of claim 1 wherein said thermal oxide islands have a thickness in a range of between about 100 and 1500 Å and have a diameter in a range of between about 100 and 1500 Å.

12. The method of claim 1 wherein said etching of said exposed cap polysilicon layer is performed with an etch using $Cl_2$ and HBr reactants.

13. The method of claim 3 wherein said first polysilicon layer is formed by depositing a amorphous silicon layer over said first silicon nitride layer, and becomes said polysilicon layer by heat processing.

14. The method of claim 1 wherein said capacitor dielectric is composed of a material selected from the group consisting of ONO, silicon nitride, $Ta_2O_5$, and silicon oxide, and has a thickness in a range between about 20 to 300 Å.

15. The method of claim 1 wherein said top plate electrode is formed of doped polysilicon having a thickness in the range between about 500 to 3000 Å and an impurity concentration in a range between about 5E19 to 5E21 atoms/cm$^3$.

16. The method of claim 1 which further includes forming a top insulation layer over said top plate electrode, said top insulation layer is formed of a material selected from the group consisting of silicon nitride, borophosphosilicate glass and tetraethylorthosilicate (TEOS) and has a thickness in a range of between about 500 and 8000 Å.

17. A method of fabricating a capacitor having multiple pillars on a substrate having an active area, the method comprising the steps of:

sequentially forming a first planarization layer and a first silicon nitride layer over a substrate surface;

etching a node contact hole through said first silicon nitride layer and said first planarization layer exposing said active area;

forming a first polysilicon layer on said first silicon nitride layer and in said node contact hole thereby making an electrical connection to said active area;

forming a cap insulation layer covering said first polysilicon layer;

forming a cap polysilicon layer over said cap insulation layer, said cap polysilicon layer having grains and having grain boundaries between said grains;

oxidizing said cap polysilicon layer to form a thermal oxide layer over said cap polysilicon layer, said thermal oxide layer growing thicker at said grain boundaries;

etching back said thermal oxide layer exposing portions of said cap polysilicon layer and leaving thermal oxide islands covering said grain boundaries and etching back said exposed portions of said cap polysilicon layer to form cap polysilicon layer pillarets and removing said thermal oxide islands;

etching said cap insulation layer using said cap polysilicon layer pillarets as a mask forming cap insulation layer pillarets;

removing said cap polysilicon layer pillarets;

etching said first polysilicon layer using said cap insulation layer pillarets as a mask forming storage electrode pillarets;

removing said cap insulation layer pillarets;

forming a hemispherical grain polysilicon (HSG-Si) layer over said storage electrode pillarets and said first polysilicon layer;

patterning said first polysilicon layer and said a hemispherical grain polysilicon (HSG-Si) layer to form a storage electrode;

forming a capacitor dielectric layer over said storage electrode pillarets and said storage electrode; and forming a top plate electrode over said capacitor dielectric layer thereby forming said capacitor having multi-pillars and forming a top insulation layer over said top plate electrode.

18. The method of claim 17 wherein said first planarization layer is composed of a material selected from the group consisting of silicon oxide and borophosphosilicate glass, and has a thickness in a range between about 500 to 10,000 Å.

19. The method of claim 17 wherein said first planarization layer comprises a first silicon oxide layer and a bottom borophosphosilicate glass (BPSG) layer, said first silicon oxide layer is formed by a chemical vapor deposition process using Tetraethylorthosilicate and has a thickness in a range of between about 500 and 5000 Å.

20. The method of claim 17 wherein said cap insulation layer has a thickness in a range of between about 300 and 3000 Å.

21. The method of claim 17 wherein said cap polysilicon layer is formed of amorphous silicon having a thickness in a range of between about 300 and 3000 Å and a p-type impurity doping in a range of between about 1E19 and 5E21 atoms/cm$^3$.

22. The method of claim 17 wherein said cap polysilicon layer is formed of amorphous silicon by a decomposition of silane ($SiH_4$) in a hot wall vertical LPCVD reactor, at a pressure of between about 80 to 200 mtorr and a temperature of between about 500° to 560° C. to produce hemispherical shaped grains (HSG) having a diameter of between about 200 to 1500 Å.

23. The method of claim 17 wherein said cap polysilicon layer and the thermal oxide layer are formed by depositing a polysilicon layer by a decomposition of silane $SiH_4$ in a hot wall LPCVD reactor, at a pressure of between about 150 to 500 mtorr and a temperature of between about 600° to 630° C. to produce hemispherical shaped grains (HSG) having a diameter of between about 500 to 1500 Å followed by a doping with $POCl_3$ at 900° C. and an oxidation thereby forming said thermal oxide layer having a thickness in a range of between about 300 and 1500 Å.

24. The method of claim 17 wherein said thermal oxide layer has a thickness at the grain boundaries in a range of between about 300 and 1500 Å and a thickness over said grains in a range of between about 100 and 500 Å.

25. The method of claim 17 wherein said thermal oxide islands have a thickness in a range of between about 100 and 1500 Å and have a diameter in a range of between about 100 and 1500 Å.

26. The method of claim 17 wherein said etching back of said exposed cap polysilicon layer is performed with an etch using $Cl_2$ and HBr reactants.

27. The method of claim 19 wherein said first polysilicon layer is formed by depositing a amorphous silicon layer over said first silicon nitride layer, and becomes said polysilicon layer by heat processing.

28. The method of claim 17 wherein said capacitor dielectric is composed of a material selected from the group consisting of ONO, silicon nitride, $Ta_2O_5$, and silicon oxide, and has a thickness in a range between about 20 to 300 Å.

29. The method of claim 17 which includes forming a top insulation layer over said top plate electrode, said top insulation layer is formed of a material selected from the group consisting of silicon nitride, borophosphosilicate glass and Tetraethylorthosilicate (TEOS) and has a thickness in a range of between about 500 and 8000 Å.

\* \* \* \* \*